United States Patent [19]

Shimozawa et al.

[11] Patent Number: 5,789,359
[45] Date of Patent: Aug. 4, 1998

[54] DETERGENT, METHOD OF CLEANING, AND APPARATUS FOR CLEANING

[75] Inventors: Hiroshi Shimozawa, Kawasaki; Masaru Kumagai, Yokohama; Fumihiko Tsuchitani, Fuchu; Mayumi Koga, Yokohama; Tadayuki Nakamura, Kobe; Nobuhiro Saitoh, Ota; Shigeo Yamafuji, Gotenba, all of Japan

[73] Assignees: Kabushiki Kaisha Toshiba, Kawasaki; Toshiba Silicone Co., Ltd., Tokyo, both of Japan

[21] Appl. No.: 553,270

[22] PCT Filed: May 17, 1994

[86] PCT No.: PCT/JP94/00796

§ 371 Date: Apr. 2, 1996

§ 102(e) Date: Apr. 2, 1996

[87] PCT Pub. No.: WO94/26864

PCT Pub. Date: Nov. 24, 1994

[30] Foreign Application Priority Data

May 17, 1993 [JP] Japan ................................. 5-115072

[51] Int. Cl.$^6$ ............... B08B 3/08; B08B 3/10; B08B 3/12; C11D 3/395
[52] U.S. Cl. ............... 510/175; 134/11; 134/26; 134/29; 134/30; 134/31; 134/40; 134/95.2; 134/113; 510/475
[58] Field of Search ................ 252/174.15; 134/11, 134/26, 29, 30, 31, 40, 94.1, 94.2, 95.2, 102.3, 113; 510/175, 475

[56] References Cited

U.S. PATENT DOCUMENTS

| | | | |
|---|---|---|---|
| 4,052,327 | 10/1977 | Arena et al. | 252/141 |
| 5,080,821 | 1/1992 | Lutringer | 252/170 |
| 5,301,701 | 4/1994 | Nafziger | 134/95.2 |
| 5,443,747 | 8/1995 | Inada et al. | 252/94 |
| 5,503,681 | 4/1996 | Inada et al. | 134/11 |
| 5,520,744 | 5/1996 | Fujikawa et al. | 134/95.2 X |
| 5,534,078 | 7/1996 | Breunshach | 134/404 |
| 5,538,024 | 7/1996 | Inada et al. | 134/60 |
| 5,593,507 | 1/1997 | Inada et al. | 134/11 |
| 5,690,750 | 11/1997 | Inada et al. | 134/11 |

FOREIGN PATENT DOCUMENTS

| | | |
|---|---|---|
| 0 350 316 | 7/1989 | European Pat. Off. . |
| 0 403 962 | 6/1990 | European Pat. Off. . |
| 0 376 779 | 7/1990 | European Pat. Off. . |
| 0 458 969 | 10/1990 | European Pat. Off. . |
| 0 516 029 | 5/1992 | European Pat. Off. . |
| 0 529 869 | 8/1992 | European Pat. Off. . |
| 40 31 563 | 4/1992 | Germany . |
| 2 084 613 | 8/1981 | United Kingdom . |

OTHER PUBLICATIONS

Database WPI, Derwent Publications Ltd., London, GB; An 89-160476 XP002008718 & JP-A-01 101 400 (Toyota Jidosha KK), Apr. 1989 *abstract*.

*Primary Examiner*—Michael Lusignan
*Attorney, Agent, or Firm*—Foley & Lardner

[57] ABSTRACT

The detergent of this invention, directed to the cleaning of an object having a gap portion at least in part thereof, contains at least one of components of the detergent having a solubility parameter difference of not more than 3 from and a contact angle within 15° with at least one of components of a smear on the object. The detergent provides an ideal cleaning for the object because it easily permeates into and dissolves the machining oil filling the gaps between closely cohering thin metallic strips. The method of cleaning according to the invention has first cleaning the object with a polar detergent and then rinsing and drying the cleaned object with a detergent having low polarity or no polarity. In the precision cleaning of such objects as electronic parts, therefore, it manifests satisfactory cleaning and drying properties. The detergent and the method of cleaning mentioned above are both safe in the environment because they have no use for such detergents as the Flon type and the chlorine type solvents which induce the destruction and the pollution of the environment.

25 Claims, 2 Drawing Sheets

DETERGENT, METHOD OF CLEANING, AND APPARATUS FOR CLEANING

TECHNICAL FIELD

This invention relates to a detergent alternative to Flon type solvents and chlorine type solvents, a method of cleaning, and an apparatus for cleaning.

BACKGROUND ART

Electronic parts such as HIC, modules, and packaged substrates, thin metallic strips such as IC, transistor grade lead frames, and hoop materials, bearings, and precision microparts, while in process of manufacture, are smeared with various kinds of smeary substances represented by water type or solvent type machining oils such as resisting agent, flux, solder paste, cutting oil, quenching oil, rolling oil, press oil, punching oil, drawing oil, assembling oil, and wire drawing oil, and dirt and dust.

The operation for the manufacture of a printed wiring board, for example, is broadly divided into a process for producing a bare board and a process for packaging IC's and electronic parts on the bare board. The printed wiring board is smeared, in the process for producing a bare board, mainly with an acid and an alkali to be used in the work of printing and the work of etching and, in the process for packaging, with the debris from solder and flux to be used in the work of soldering electronic parts. The particular smeary substances that must be removed from the smeared printed wiring board are the active agent contained in the flux and such organic salts as $CuCl_2$ and $(RCOO)_2Cu$ which are the products of reaction between the active agent and the oxide film originating in the action of the active agent with the basis of substrate. These smeary substances are polar in quality. If they remain on the produced printed wiring board, therefore, they will absorb moisture and induce such adverse phenomena as leakage, migration, degradation of the magnitude of insulation resistance, and corrosion of pins and wires. Then, in the case of the operation of manufacture of a semiconductor, the ingress to the semiconductor of an ionic substance as an extraneous matter poses a serious problem called a "sodium panic." In the case of metallic parts obtained by machining, these smeary substances when suffered to persist entail such problems as corrosion and discoloration. These smeary substances, therefore, must be removed before the start of a next process or during the finishing process of a product.

As detergents for the removal of these smeary substances, Flon type solvents represented by Flon 113 and organic solvents such as trichloroethane, trichloroethylene, tetrachloroethylene, and carbon tetrachloride have been heretofore used extensively.

Recently, the widespread appreciation of the fact that the release of Flon type solvents into the ambient air results in the depletion of the ozonosphere and exerts a serious influence on human bodies and biotic systems has been urging the necessity for gradually tightening the restriction imposed on the use of Flon 12 and Flon 113 which have high ozone depletion coefficients and eventually totally banning the use thereof on the global scale. Further, since the chlorine type organic solvents such as trichloroethylene and tetrachloroethylene are held responsible for the environmental problem of inducing pollution of soil and ground water, the restriction imposed on their use is tending toward increasing exaction.

Under the circumstances, Flon type substances which have lower ozone depletion coefficients than the existing Flon type solvents are being developed and they have been already put to commercial production partly. These Flon type substances are not regarded as fully ideal alternative detergents, however, because they are not absolutely incapable of depleting the ozonosphere. Thus, attempts are being made to switch the Flon type detergents currently used on numerous industrial products to water, alkalis, and solvents.

The main alternative methods heretofore proposed for the cleaning of a printed wiring board include a water type cleaning method which resides in removing a water-soluble flux with purified water, a semi-water type cleaning method which comprises removing the flux with a solvent and then rinsing the resultant surface with water, and a solvent cleaning method which consists in using such an organic solvent as a hydrocarbon, for example.

Thin metallic strips such as lead frames and hoop materials, bearings, and precision microparts, however, mostly possess portions which intimately adhere to each other through the medium of the thickness of an oil film. The portions so adjoined across the intervening oil film as described above have the problem that extreme difficulty is incurred in the removal of the oil film from the adjoining portions. The so-called "modular" lead frames which have been punched out of a metallic sheet, for example, intimately cohere through the medium of a machining oil used in the process of fabrication. When these cohering lead frames are to be cleaned, a given detergent is required to permeate the film of machining oil intervening between the adjacent lead frames and dissolve and remove the oil film. No other detergent than the Flon type solvents or the chlorine type solvents has yet been found to fulfill this requirement.

During the cleaning of such lead frames as described above, a given detergent permeates the gap between the intimately cohering portions by virtue of capillarity. So long as the permeation is a sole purpose, it will suffice to use a solvent of low surface tension as the detergent in this case. Solvents having low surface tension are generally non-polar solvents. Incidentally, since the machining oil mentioned above is used under very harsh conditions, it generally contains such polar substances as an oiliness agent and an extreme pressure agent in unusually large amounts. Though a solvent of low surface tension which is consequently a non-polar solvent excels in the ability to permeate the gap between the intimately cohering portions, the deficiency of this solvent in the dissolving power does not adapt the solvent for an alternative detergent. This fact renders difficult the development of a detergent alternative to the Flon type solvents or the chlorine type solvents.

The water type and the semi-water type cleaning method proposed for the cleaning of a printed wiring board are expected to provide highly efficient removal of polar substances. The use of either of these methods, however, entails the problem that the adsorption of water on or the permeation of water in a glass epoxy substrate or a paper phenol substrate results in degrading such electric resistances as surface insulation resistance. Further, the parts for which the precision cleaning mentioned above is necessary have the problem that the cleaning method under discussion impairs the drying property and debases the appearance and other properties with rust, discoloration, and smudge from drying.

When the electric properties of a product after it has been cleaned are taken into account, the solvent cleaning by the use of such a non-polar substance as a hydrocarbon proves to be desirable. The non-polar substance such as a hydrocarbon, however, cannot be expected to exhibit due detergency to ionic substances, polar substances, and persistent smears. To be specific, the properties which are necessary for cleaning and those which are necessary for drying embrace contradictory elements. For this reason, various attempts have been made to switch the cleaning of industrial products from the conventional detergents to the water type, the alkali type, and the solvent type detergents. With the alternative detergents proposed heretofore, however, it is extremely difficult to give a fully satisfactory wash to electronic parts, precision parts, etc. Such is the true state of affairs.

This invention has been produced for the purpose of coping with the task of solving the difficulties encountered by the prior art as mentioned above. It has for an object thereof the provision of a detergent for use with such articles as thin metallic strips, bearings, and precision microparts incorporating therein portions tightly adjoined through the medium of an oil film, which detergent exhibits a cleaning ability favorably comparable with that of such detergents as the Flon type solvents and the chlorine type solvents and avoids inducing destruction of the environment or the pollution of the environment, and a method of cleaning and an apparatus for cleaning by the use of the detergent.

Further, this invention, in association with the method of cleaning printed wiring boards and electronic parts such as the parts to be packaged thereon, aims to provide a method of cleaning which is comparable favorably with the cleaning method using the Flon type solvent or the chlorine type solvent and also provide an apparatus for cleaning which is operated in accordance with this method of cleaning.

DISCLOSURE OF THE INVENTION

The first detergent of this invention is a detergent for cleaning an object which has a gap portion in at least part thereof and is characterized by containing a detergent component having a solubility parameter difference of not more than 3 from at least one of the components of a smear. It is also characterized by containing a detergent component having a solubility parameter difference of not more than 3 from at least one of the components of the smear and, at the same time, having a contact angle within 15°. It is further characterized by containing a component having a solubility parameter difference of not more than 3 from not less than 5% by weight of the components of the smear and, at the same time, a component having a contact angle within 15°.

The first detergent is characterized by containing at least one component selected from among polyorganosiloxanes and organic carbon compounds.

The object to be cleaned with the first detergent of this invention is characterized by having been treated with machining oil containing at least one component selected from among base oil, oiliness agent, and extreme pressure agent and having an oil film of a thickness in the range of 0.001 to 2000 μm in the gap portion thereof.

The first method of cleaning contemplated by this invention is characterized by cleaning an object having a gap portion in at least part thereof by the use of the detergent mentioned above. It is also characterized by comprising a step of cleaning the object and a step of drying the object which has been cleaned. It is further characterized by using a perfluoro compound as a vaporous detergent.

The first apparatus for cleaning according to this invention is an apparatus for cleaning an object having in part thereof a gap portion of a machining oil composition by the use of the detergent mentioned above, which apparatus is characterized by comprising cleaning means formed of a single bath or a plurality of baths, drying means, and distilling means for distilling the detergent which has overflowed the cleaning bath and/or a liquid separating device for regenerating and separating the vaporous detergent which has cleaned the object. It is also characterized by the fact that the distilling means is provided with a storage bath for storing the distillate obtained by the distillation and the cleaning bath is provided with a detergent level sensor for keeping the surface of the detergent in the bath at a stated level and, whenever the surface falls below the stated level, enabling the detergent to be supplied from the storage bath and circulated by overflowing. It is further characterized by being provided with a device for detecting a component other than the detergent.

The second method of cleaning according to this invention is a method of cleaning printed wiring boards and electronic parts such as parts packaged thereon, which method is characterized by involving at least one step selected from the group consisting of a step of cleaning an object with a polar detergent having a solubility parameter of not less than 9 or a dielectric constant of not less than 4, a step of rinsing the cleaned object with a detergent having a solubility parameter of less than 9 and a dielectric constant of less than 4, and a step of drying.

The first detergent of this invention has been produced on the basis of a new knowledge that the factors which govern the cleaning property of a given detergent depend greatly on the solubility parameter and surface tension of each component of the detergent which corresponds to each component of machining oil cohering to an object to be cleaned. Specifically by optimizing the composition of the detergent in consideration of the components of the machining oil and cleaning the object by the use of the detergent of the optimum composition, therefore, the produced detergent is enabled to combine the penetrating property manifested to the gap between intimately adhering portions and the dissolving power which renders the components of the machining oil removable by cleaning. As a result, the portions cohering through the medium of oil to which no other detergent than the Flon type and the chlorine type solvents has heretofore provided an effective cleaning can be now cleaned effectively by the first detergent of this invention.

Now, the first detergent, method of cleaning, and apparatus for cleaning contemplated by this invention will be described below.

The object for cleaning according to this invention is an article which contains at least partly therein portions cohering to each other through the medium of a film of machining oil and uses a metallic, semimetallic, ceramic, or plastic material. The kind of the material is not critical. As examples of metallic and semimetallic materials, iron, aluminum, silicon, copper, and stainless steel can be cited, as examples of ceramic materials, silicon nitride, silicon carbide, aluminum oxide, glass, and porcelain can be cited, and as examples of plastic materials, polyamides, polyimides, polyolefins, polyesters, and acrylic resins can be cited. Composites of the materials mentioned above can be cited as other materials usable for the article under consideration. Specifically, metallic parts, surface-treated parts, electronic parts, semiconducting parts, electric parts, precision mechanical parts, optical parts, glass parts, and ceramic parts are concrete examples of the object for cleaning.

The lead frame for a semiconductor device which is illustrated in FIG. 1A and FIG. 1B is a typical example of the object for cleaning contemplated by this invention. FIG. 1A is a plan view and FIG. 1B is a cross section taken through FIG. 1A along the line A—A. In the lead frame of the kind illustrated, metallic thin strips 1 are held contiguously to each other through a machining oil film 2. The oil film has a thickness of at least about 0.001 μm. In spite of this small thickness of the oil film, the detergent of this invention permeates the gaps between the strongly cohering thin strips and easily cleans the thin strips of the machining oil. If the oil film has a thickness exceeding 2000 μm, the thin strips will not easily assume a tightly cohering state and will be cleaned with some other detergent or by other method of cleaning. The object for cleaning contemplated by this invention incorporates partly therein portions cohering to each other through the medium of an oil film. This object is cleaned particularly advantageously by this invention when the cohering thin strips are separated by an oil film of a thickness in the range of 0.01 μm to 100 μm. The expression "incorporates partly therein cohering portions" as used in this specification also embraces a case in which adjacent portions contact each other at a point as in a bearing. Further, this invention can be applied effectively to a lead frame in which component metallic thin strips 1 cohere in an area exceeding 100 mm$^2$. It can be advantageously applied where the area of contact exceeds 100 mm$^2$, 800 mm$^2$, 2,500 mm$^2$, and 4,000 mm$^2$. The most desirable object for cleaning in accordance with this invention has an area of contact exceeding 7,000 mm$^2$.

Now, the machining oil which adheres to the object for cleaning contemplated by this invention will be described below. The term "machining oil" refers to such water type or solvent type oils as cutting oil, hardening oil, rolling oil, pressing oil, punching oil, drawing oil, assembling oil, and wire drawing oils which contain at least one component selected from the group consisting of base oils, oiliness agents, and extreme pressure agents.

The base oils are known in three kinds, i.e. synthetic oils, mineral oils, and natural oils. As concrete examples of the synthetic oils, polyol esters, diesters, polyolefins, dialkyl benzenes, polyethylene glycols, alkyl diphenyl ethers, alkyl naphthalenes, polyphenyl ethers, silicone oils, iso-paraffins, phosphoric esters, silicates, and fluorine compounds can be cited. As concrete examples of the mineral oils, solvent-refined or hydrogenation-refined base oil agents and low-temperature pour-point base oil agents endowed with improved low-temperature flowability can be cited. As concrete examples of the natural oils, such fatty acid glycerides as natural oils and fats including animal and vegetable oils and fats can be cited.

As concrete examples of oiliness agents, such higher fatty acids as oleic acid, stearic acid, iso-stearic acid, palmitic acid, arachic acid, and cerotic acid and such long-chain alcohols as oleyl alcohol and stearyl alcohol can be cited.

As concrete examples of the extreme pressure agent, such sulfur compounds as diphenyl disulfide, didodecyl disulfide, dibenzyl disulfide, and sulfur, such phosphorus compounds as trilauryl phosphite, trilauryl phosphate, lauric acid phosphate, and dilauryl phosphite, such chlorine compounds as monochloro-benzene, pentachlorodiphenyl, chlorinated paraffins, hexachloro-ethane, methyl trichlorostearate, and methyl pentachlorostearate, and such organic metal compounds as zinc dithiophosphate, molybdenum dithiophosphate, molybdenum xanthate, and tribenzyl boric acid can be cited.

As other additives of the machining oil, emulsifiers and demulsifiers and such abrasion-resistant agents or abrasion-proofing agents as phosphoric esters and metal salts of dithiophosphoric acid can be cited. Further, such additives as antioxidant, surfactant, water-acid sequestrant, detergent dispersant, metal inactivator, flow point depressant, viscosity index enhancer, corrosion-proofing agent, and rust preventive are usable. In cases where these additives are incorporated in the machining oil at high concentrations, the detergent to be used is desired to contain at least a detergent component having a solubility parameter difference of not more than 3 from these additives or a detergent component having a contact angle within 15° and a solubility parameter difference of not more than 3.

The "solubility parameter" involved in this invention (hereinafter referred to as "δ") is defined by the following formula (1).

$$\delta = (\Delta E/V)^{1/2} \tag{1}$$

wherein ΔE stands for molecular cohesive energy (cal/mol) and V for molecular volume (ml/mol). Thus, the solubility parameter, δ, equals the square root of the cohesive energy density.

When the mixture of two components entails no change in volume, the heat of solution, ΔHm, which is generated when the first and the second component are mixed and dissolved is expressed by the following formula (2) as proposed by J. H. Hildebrand.

$$\Delta Hm = Vm(\delta_1 - \delta_2)^2 \phi_1 \phi_2 \tag{2}$$

wherein Vm stands for the total volume (ml) of the mixture, φ for volumetric proportion, and the subscripts 1 and 2 respectively represent the first and the second component.

The formula (2) indicates that the heat of solution, ΔHm, of the first and the second component decreases and the compatibility thereof gains in excellence in proportion as the difference between δ$_1$ and δ$_2$ decreases.

In the cleaning of the object for cleaning in accordance with the present invention, thorough solution and removal of the machining oil component deposited on the object can be obtained when the difference between the solubility parameters, δ, of the machining oil component and the detergent component is not more than 3.

The solubility parameter, δ, can be determined by any of such known methods as the method of latent heat of vaporization and the method of molecular attraction constant. The method adopted for the determination of the solubility parameter, δ, has no particular restriction. In any event, it suffices that the magnitude of the solubility parameter, δ, determined by any of such methods should satisfy the conditions of the present invention. Generally, the magnitude determined by the method of latent heat of vaporization is used where the relevant substance permits determination of the boiling point thereof or that determined by the method of molecular attraction constant is used where the substance either defies determination of the boiling point or does not permit easy determination of the boiling point and has a known chemical structural formula.

The method of latent heat of vaporization comprises finding ΔH from the following formula (3), finding ΔE from the following formula (4) using the found magnitude of ΔH, and finding δ from the following formula (5) which is derived from the formula (1). This method is most direct and permits exact calculation of δ.

$$\Delta H_{25} = 23.7Tb + 0.020Tb^2 - 2950 \tag{3}$$

$$\Delta E = \Delta H - RT \tag{4}$$

$$\delta = (\Delta E/V)^{1/2} = \{(d/M)\Delta E\}^{1/2} \tag{5}$$

wherein Tb stands for boiling point (K), R for gas constant (1.986 cal/mol), T for absolute temperature (K), d for density (g/ml), and M for molecular weight (g/mol).

In the case of a liquid paraffin as a base oil having a main component of $C_{10}H_{22}$, for example, since M=142.29, Tb=200° C. (=473K), and d=0.896 (g/ml), the solubility parameter, δ, of the liquid paraffin is found as follows:

$$\Delta H_{25} = 23.7 \times 473 + 0.020 \times 473^2 - 2950 = 12192.5$$

$$\Delta E = 12192.5 - 1.986 \times 298 = 11600.7$$

$$\delta = \{(0.896/142.29) \times 11600.7\}^{1/2} = 8.55$$

The solubility parameter of a compound containing a hydrogen bond ($\delta_c$) is obtained by adding the following correction value to the magnitude of the solubility parameter, δ, obtained as shown above. Alcohols; $\delta_c = \delta + 1.4$, esters; $\delta_c = \delta + 0.6$, and ketones; $\delta_c = \delta + 0.5$. No correction is necessary where the boiling point of a given compound exceeds 100° C.

The method of molecular attraction constant determines the solubility parameter, δ, on the basis of the characteristic values of the component functional groups (atoms or atomic groups) of the molecular unit of a given compound, namely the total of molecular attractions (G) and the molecular volume. It proves to be useful for the determination of the solubility parameter, δ, such as of resin which, unlike solvents, is not easily vaporized. The solubility parameter, δ, is determined by the following formula (6).

$$\delta = \Sigma G/V = d \cdot \Sigma G/M \quad (6)$$

wherein G stands for a value equivalent to the product of the molecular cohesive energy multiplied by the molecular volume (molecular volume cohesive energy). The empirical values of G of various compounds have been published by Small et al.

In the case of the sulfur in the sulfide oil as an extreme pressure agent, for example, since M=32.07 and d=2.07 (g/ml) and the value of G is 225 [cal-ml$^{1/2}$/mol] as reported by Small et al., the solubility parameter, δ, is found as follows:

$$\delta = 2.07 \times 225/32.07 = 14.5$$

Then, the solubility parameter of a mixture, $\delta_m$, is generally determined as the additive average of the mole fractions of the solubility parameters, δ, of the components of the mixture in accordance with the following formula (7):

$$\delta_m = \Sigma X_i \delta_i \quad (7)$$

wherein the subscript i stands for an i'th component.

In the case of a sulfide oil containing 0.43 mol of liquid paraffin as a base oil and 1 mole of sulfur, for example, the solubility parameter, $\delta_m$, of this sulfide oil is determined as follows:

$$\delta_m = \{1/(1+0.43)\} \times 14.5 + \{0.43/(1+0.43)\} \times 8.58 = 12.7$$

The contact angle which characterizes the detergent of this invention is a characteristic value which can form an index of the permeating power exhibited by the detergent to the portions tightly cohering through the medium of the thickness of an oil film and is determined by the following method.

A machining oil is coated to a ground glass sheet and 2 of a detergent component subjected to determination of a contact angle is dropped on the coated layer of the machining oil on the glass sheet and the contact angle of the detergent component resting thereon is measured with a contact angle tester (such as, for example, a product of Kyowa Kaimenkagaku K.K. marketed under product code of "CA-S 150"). The drops of the detergent component, as soon as they land on the coated layer of the machining oil, possibly spread out quickly by wetting the surface of the machining oil. This determination, therefore, ought to be completed within 2 seconds after the landing. The contact angle thus determined forms a criterion for the evaluation of the wettability of the machining component with the detergent component and the estimation of the permeability of the gaps of machining oil in a given object for cleaning to the detergent component. The determination of the contact angle is carried out at 25° C.

In the cleaning of the object for cleaning according to this invention, when the difference of solubility parameter, δ, between the machining oil component and the detergent component is not more than 3 and the contact angle mentioned above is within 15°, the portions of the object having such thin metallic strips as lead frames or hoops tightly adjoined to each other through the medium of a thickness of oil film are permeated easily by the detergent component and consequently cleaned thoroughly of the machining oil by virtue of ready solution. The difference of the solubility parameter, δ, is desired to be not more than 2, preferably not more than 1, and the contact angle is desired to be within 10°, preferably within 5°.

In cases where the machining oil contains a base oil, an oiliness agent, and an extreme pressure agent wholly, the detergent of this invention is desired to be such that the detergent components thereof may severally satisfy the conditions of the solubility parameter and the contact angle mentioned above.

The detergent of this invention contains at least one component selected from among polyorganosiloxanes and organic carbon compounds. The polyorganosiloxane for the detergent of this invention is desired to be at least one low molecular weight polyorganosiloxane to be selected from the group consisting of straight chain polyorganosiloxanes represented by the following formula (I):

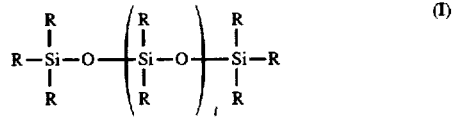

(wherein R is independently selected from the group consisting of a substituted and an unsubstituted monovalent organic group and 1 is an integer from 0 to 5) and cyclic polydiorganosiloxanes represented by the following formula (II):

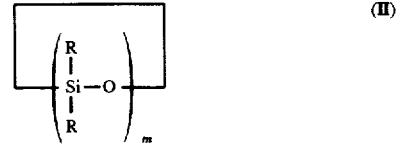

(wherein R is independently selected from the group consisting of a substituted and an unsubstituted monovalent organic group and m is an integer from 3 to 7).

The low molecular weight polyorganosiloxane thus selected from the group defined above manifests a great permeating power to the contaminated layer and constitutes a component characteristic of this invention. The R in the formulas (I) and (II) mentioned above stands for a substituted or unsubstituted monovalent organic group. As concrete examples of this group, such unsaturated monovalent hydrocarbon groups as alkyl groups including methyl group, ethyl group, propyl group, and butyl group and phenyl groups and such monovalent substituted hydrocarbon groups as trifluoromethyl group and 3,3,3-trifluoro-propyl group can be cited. As concrete examples of the symbol R at the terminal of the formula (I) mentioned above, amino group, amide group, acrylic ester groups, and mercaptan group can be cited. Among other groups enumerated above, methyl group proves to be most desirable from the standpoint of the retention of stability of the relevant system of the detergent and volatility.

As the low molecular weight polyorganosiloxane, it is particularly desirable in terms of permeating power and cleaning property to use octamethylcyclotetrasiloxane and decamethylcyclopentasiloxane which have a cyclic structure and a mixture thereof or octa-methyltrisiloxane and decamethyltetrasiloxane which have a linear structure. In cases where the machining oil contains a strongly alkaline detergent component, the low molecular weight polyorganosiloxane is desired to have a linear structure represented by the formula (I) mentioned above from the viewpoint of the stability of polysiloxane.

The organic carbon compounds which are available for the detergent component of this invention include aliphatic hydrocarbon compounds such as normal-paraffins, isoparaffins and olefins, alicyclic hydrocarbon compounds such as cycloparaffins and cycloolefins, aromatic hydrocarbon compounds, alcohols, ketones, esters, fatty acids, and hydrocarbon fluorides. As concrete examples of the organic carbon compounds, normal decane, isododecane, gasoline, gasoline with rubber, mineral spirit, kerosene, naphthenic hydrocarbons (boiling points 160° to 200° C.), terpene oil, limonene, benzene, toluene, xylene, methanol, ethanol, propanol, normal butanol, normal hexanol, 2-ethyl-hexanol, normal octanol, cyclohexanol, acetone, methylethyl ketone, methylisobutyl ketone, diisobutyl ketone, cyclohexanone, methyl acetate, ethyl acetate, butyl acetate, diethylene glycol monobutyl ether, ethyl lactate, and octadecafluorooctane can be cited.

The detergent composition of the present invention and the percentage composition thereof can be fixed in consideration of the components of the oil film keeping the adjacent portions in fast cohesion in an object for cleaning.

As regards the detergent composition, the components of the detergent can be selected on the basis of any one of the components of the oil film. It is particularly desirable to use any one component selected from the group consisting of base oil, oiliness agent, and extreme pressure agent as the basis.

As the detergent component based on the base oil of the machining oil, the detergent is desired to incorporate therein a low molecular weight polyorganosiloxane, an aliphatic hydrocarbon compound, or an aromatic hydrocarbon compound. Particularly, it is desirable to adopt a low molecular weight polyorganosiloxane for the purpose of the incorporation.

As the detergent component based on the oiliness agent of the machining oil, the detergent is desired to incorporate therein an aliphatic hydrocarbon compound, an aromatic hydrocarbon compound, or a low molecular weight polyorganosiloxane. Particularly, it is desirable to adopt an aliphatic hydrocarbon compound for the purpose of the incorporation.

As the detergent component based on the extreme pressure agent of the machining oil, the detergent is desired to incorporate therein an alcohol, a ketone, an ester, or a fatty acid. Particularly, it is desirable to adopt an aliphatic alcohol having from 5 to 10 carbon atoms for the purpose of the incorporation.

It is especially desirable to use a low molecular weight polyorganosiloxane in combination with some other detergent component. Particularly, the detergent which contains a low molecular weight polyorganosiloxane represented by the formula (I) or (II) mentioned above, owing to its great permeating power and cleaning power manifested to the interfaces of thin metallic strips, manifests a cleaning effect favorably comparable with that which is obtained by the Flon type detergent which has found popular acceptance to date.

Concrete examples of the detergent components mentioned above are shown in Table 1, Table 2, and Table 3. Table 1 shows examples of detergent components using mineral oils as base oil ($\delta$ value; 8), Table 2 those using oleic acids as oiliness agent ($\delta$ value; 9), and Table 3 those using sulfide oils as extreme pressure agent ($\delta$ value; 12) respectively.

TABLE 1

| Contact angle to mineral oil $\delta$ value | 0 to less than 5 | 5 to less than 10 | 10 to less than 15 |
|---|---|---|---|
| 5 to less than 6 | Octadecafluorooctane | | |
| 6 to less than 7 | Octamethylcyclotetrasiloxane | | |
| 7 to less than 8 | Normal decane Isododecane Naphthene (bp 160–200° C.) | Diisobutylketone | |
| 8 to less than 9 | Terpene oil Normal propylbenzene | Normal butylacetate | |
| 9 to less than 10 | Xylene Benzene | Cyclohexanone | Diethyleneglycol-monobutylether |

Note)
$\delta$ value of mineral oil as base oil: 8

TABLE 2

| Contact angle to oily agent $\delta$ value | 0 to less than 5 | 5 to less than 10 | 10 to less than 15 |
|---|---|---|---|
| 6 to less than 7 | Octamethylcyclotetrasiloxane | | |
| 7 to less than 8 | Isododecane Naphthene (bp 160–200° C.) | | |
| 8 to less than 9 | Terpene oil Normal butylacetate Normal propylbenzene | | |
| 9 to less than 10 | Cyclohexanone Xylene Benzene | 2-Ethylhexanol | Diethyleneglycol-monobutylether |

TABLE 2-continued

| Contact angle to oily agent δ value | 0 to less than 5 | 5 to less than 10 | 10 to less than 15 |
|---|---|---|---|
| 10 to less than 11 | | Acetone Ethyl-lactate Normal-octanol | |
| 11 to less than 12 | | | Normal-butanol |

Note)
δ value of oleic acid as oiliness agent; 9

TABLE 3

| Contact angle to extreme pressure agent δ value | 0 to less than 5 | 5 to less than 10 | 10 to less than 15 |
|---|---|---|---|
| 9 to less than 10 | 2-Ethyl-hexanol | Diethylene-glycol-monobutyl-ether | |
| 10 to less than 11 | Acetone Ethyl-lactate | Normal-octanol | |
| 11 to less than 12 | | Normal-butanol | |
| 12 to less than 13 | | | Dimethyl-formamide Benzyl-alcohol |
| 13 to less than 14 | | | Piperidine |
| 14 to less than 15 | | | Methanol |

Note)
δ value of sulfide oil as extreme pressure agent; 12

The mixing ratio of the components of the detergent can be fixed in consideration of the composition of the components of the oil film. In the case of an oil film which is composed of 60% by weight of base oil, 30% by weight of an oiliness agent, and 10% by weight of an extreme pressure agent, for example, it suffices to use the detergent components corresponding to the components of the oil film in the respective proportions of 60% by weight, 30% by weight, and 10% by weight. Generally, in due respect of the composition of the machining oil which is adapted for the recent microprocessing operation, it is desirable to fix the proportion of the detergent component corresponding to the extreme pressure agent in the range of 10 to 20% by weight and that of the detergent component corresponding jointly to the base oil and the oiliness agent in the range which accounts for the balance to make up 100% by weight. In this case, the ratio of the detergent components corresponding respectively to the base oil and the oiliness agent, i.e. the ratio of "the detergent component corresponding to the base oil/the detergent component corresponding to the oiliness agent", is desired to be in the range of 10/90 to 90/10.

One example of a desirable detergent is shown below.

A detergent composed of from 80 to 90% by weight of a low molecular weight polyorganosiloxane and a hydrocarbon (wherein the ratio of low molecular weight polyorganosiloxane/hydrocarbon=10/90 to 90/10) and 10 to 20% by weight of an alcohol, a ketone, an ester, or a polyether.

An object having portions thereof adjoined fast through the medium of an oil film, for example, is cleaned with the detergent described above by a procedure which comprises immersing this object with the cohering portions kept intact in the detergent, subjecting the object to ultrasonic cleaning, shaking, mechanical stirring, heating, or brushing, and subsequently finishing the cleaned object as by drying.

The step of drying is desired to be carried out by vapor drying. The drying by the vapor drying is ideal such as for precision cleaning because it allows the finishing by drying to be attained more advantageously. The vapor drying agent which fits this invention satisfies such conditions as (1) excelling in compatibility with the liquid which is brought in from the preceding step, specifically having a difference of solubility parameter, δ, of not more than 3, (2) having a latent heat of vaporization different slightly from that of the liquid brought in from the preceding step, namely the difference of latent heat of vaporization being not more than 3 times and not more than 200 cals/g in magnitude, and (3) having a boiling point higher, specifically by not less than 30° C., than the temperature of the surface of the object at the time of vapor drying. Basically, it is required to fulfill the conditions of (1) and (2), and preferably in combination with the condition of (3). As concrete examples of the vapor drying agent satisfying these conditions, perfluoro compounds, low molecular weight polyorganosiloxanes, aliphatic hydrocarbons, aromatic hydrocarbons, and halogenated hydrocarbons can be cited. Among other concrete examples mentioned above, perfluoro compounds, low molecular polyorganosiloxanes, and halogenated hydrocarbons prove to be particularly desirable in respect that they are capable of effecting vapor drying ideally without leaving any smudge behind on the cleaned surface. It is especially desirable to use perfluoro compounds because they have only sparing inflammability and are incapable of destroying the ozonosphere.

It is allowable to use such perfluoro compounds as are represented by the formula (III):

$$C_nF_{2n+2} \tag{III}$$

(wherein n is an integer from 4 to 12) and such perfluoro compounds as are represented by the group of structural formulas (IV):

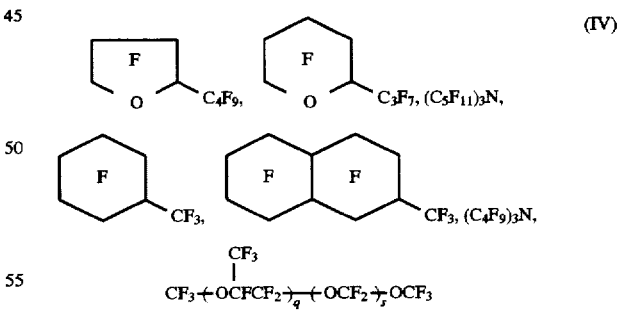

(wherein q and s each stand for any desired integer). These perfluoro compounds have δ values in the neighborhood of 5 to 6 and latent heat of vaporization of about 20 cal/g and boiling points varied in the approximate range of from 50° C. to 200° C. and satisfy wholly the conditions of (1) through (3) mentioned above. Of these perfluoro compounds, those which have boiling points in the approximate range of from 50° C. to 150° C. are desirably used for actual cleaning. Since these perfluoro compounds manifest no compatibility with virtually all organic solvents, they have never been used as vapor drying agents except for the purpose of removing particles. In the present invention which uses polyorganosiloxanes and organic carbon compounds for the detergent, since the perfluoro compounds manifest compatibility with these detergent components, they can be used effectively as vapor drying agents.

The methods now available for the production on a commercial scale of the perfluoro compounds for use in this invention are represented by the method of electrolytic fluorination of a relevant hydrocarbon, namely the displacement of H with F. Depending on the conditions of this reaction, therefore, the displacement with F fails to proceed completely and, as a result, a hydrofluoro compound (HFC form) having H and F atoms linked to varying carbon atoms is suffered to persist in a produced perfluoro compound (PFC form). This by-product (HFC form) or the mixture thereof with a perfluoro compound (PFC form+HFC form) can be used as effectively in this invention as the perfluoro compound.

This invention allows hydrofluoro compounds (HFC form) to be used as the vapor drying agent.

To be used advantageously, these hydrofluoro compounds are desired to have the structures represented by the following formulas (V):

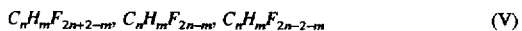

$$C_nH_mF_{2n+2-m},\ C_nH_mF_{2n-m},\ C_nH_mF_{2n-2-m} \qquad (V)$$

In the formulas, n is desired to be in the range of 1 to 10 and m in the range of 0 to 20 because the relevant compounds possess boiling points which fall in practically suitable ranges. As concrete examples of the hydrofluoro compounds which befit this invention, $C_5H_1F_{11}$, $C_5H_2F_{10}$, $C_5H_3F_9$, $C_4H_3F_7$, and $C_6H_2F_{12}$ can be cited.

Further, the introduction of a halogen results in improving the dissolving power of a PFC compound or an HFC compound. A halogenated hydrofluoro compound having a low ozone depletion coefficient (such as a HCFC form) can be also used effectively. As concrete examples of such halogenated hydrofluoro compounds, $C_3H_1Cl_2F_5$ and $C_2H_2Cl_2F_2$ can be cited.

As the vapor drying agent, the perfluoro compound is not required to be used all by itself. It can be used, for example, as a mixture thereof with isopropyl alcohol or as a composition thereof with other solvents such as polyorganosiloxane or an organic carbon compound. The organic solvents which are usable in the composition do not necessarily exclude Flon type solvents or chlorine type solvents. Of course, it is desirable to avoid using the Flon type or the chlorine type solvents from the viewpoint of environmental pollution. They are nevertheless useful temporary expedients until the total ban on the use of these ozone destroying compounds takes effect.

When the mixture mentioned above is used as a vapor drying agent, the δ values and the latent heats of vaporization of the components of the mixture are desired to satisfy the conditions of (1) and (2) mentioned above. The magnitudes of these physical constants are identical with those already specified. The incorporation in the mixture of an organic solvent having a δ value and a latent heat of vaporization which are both on intermediate levels proves to be effective.

Now, the apparatus for cleaning for which the first detergent and the method of cleaning contemplated by this invention as described above are ideally adapted will be described below.

The first apparatus for cleaning according to this invention is provided with cleaning means formed of a single bath or a plurality of baths, drying means, and distilling means for distilling a detergent which has overflowed the cleaning bath and/or a liquid separating device for regenerating and separating a vapor drying agent which has given vapor drying to an object for cleaning. The distilling device and the liquid separating device can be operated during the process of cleaning or during the step of the cleaning operation. The distilling device and the liquid separating device are desired to separate the detergent and the vapor drying agent each at a purity of not less than 95% by weight. As concrete examples of the liquid separating device, a device which effects the separation of liquid by virtue of difference in specific gravity and a filtering device can be cited. In cases where a perfluoro compound is used as the vapor drying agent, it is desirable to adopt the device which utilizes the difference in specific gravity.

The cleaning bath, as occasion demands, can be used in combination with such auxiliary cleaning devices as are designed to generate ultrasonic wave, oscillation, or mechanical agitation, apply heat to the detergent, or exert a brushing motion on the surface of an object for cleaning. Further, the cleaning bath can be furnished with a device for detecting the presence of such smeary substances as rolling oil and cutting oil and the concentrations thereof. Though the detecting device is not particularly restricted, it is desired to make effective use of an infrared spectrophotometer or an ultraviolet spectro-photometer which is capable of detecting and determining a minute amount of smeary substance. It is further desirable for the sake of enhancing the sensitivity of the detecting device to install a foreign matter removing filter in front of the detecting device.

The detergent which has given a wash to the object for cleaning overflows the upper part of the cleaning bath. After having overflowed the cleaning bath, the used detergent is led to the distilling device, wherein it is regenerated and separated by distillation. The detergent thus regenerated and separated is stored in a storage bath and then supplied again to the cleaning bath by detergent feeding means which is interlocked with a liquid level sensor installed in the cleaning tank.

The vapor drying agent is guided through the lower part of the vapor drying bath to the liquid separating device adapted to operate by virtue of difference in specific gravity and then is separated therein from the other components.

The apparatus for cleaning which is constructed as described above allows the detergent and the vapor drying agent to be put to reuse with high efficiency and, therefore, decreases the waste of cleaning, and contributes advantageously to ensure the hygiene of the environment.

The first detergent according to this invention has a contact angle within 15° relative to the component of machining oil as described above and, therefore, easily permeates the gaps between lead frames which closely cohere through the medium of an oil film. Further, since this detergent has a difference of solubility parameter, δ, of not more than 3 and, therefore, is excellent in mutual solubility with the machining oil, it easily dissolves the residual oil persisting in the gaps mentioned above and cleans the gaps of the dirty oil.

The first method of cleaning according to this invention permits precision parts to be easily cleaned and dried because it comprises a step of cleaning and a step of drying by vapor drying. Particularly, by the use of the vapor drying agent formed of a perfluoro compound which exhibits a good compatibility with polyorganosiloxanes and organic carbon compounds, this method enables a given object to be finished ideally by cleaning and drying.

Further, the first apparatus for cleaning according to this invention can be used for giving a wash to the object and meanwhile separating and regenerating the detergent and the vapor drying agent because it is provided with the distilling device and/or the liquid separating device. Optionally, this apparatus for cleaning can be used effectively in the second method of cleaning which will be described hereinbelow.

The second method of cleaning according to this invention has been perfected on the basis of a new knowledge that an object for cleaning such as an electronic part can be ideally cleaned by dividing functions, i.e. by first cleaning the electronic part with a polar solvent having a solubility parameter, $\delta$, of not less than 9 or a dielectric constant of not less than 4 and then rinsing and/or drying the cleaned electronic part with a detergent having a solubility parameter, $\delta$, of less than 9 and a dielectric constant of less than 4.

Now, the second method of cleaning according to the present invention will be described below.

The term "cleaning" as used in this invention means the act of minimizing the concentration of smears adhering to an object for cleaning or removing the smears from the object. The term "rinsing" means the act of minimizing the concentration of a detergent adhering to the object which has undergone the cleaning or removing the detergent from the object. Then, the term "drying" means the act of removing or vaporizing the detergent or the rinsing agent adhering to the object. The "drying" is attained by various methods such as spontaneous drying, vacuum drying, hot air drying, vapor drying, and displacement with a solvent having a higher vapor pressure, for example.

The polarity of the polar detergent to be used in this invention is related to solubility parameter, dielectric constant, dipole moment, molecular polarizability, dissociation constant, molecular refractive index, and acid-base interaction, for example. A polar detergent is usable for this invention on the condition that it has a $\delta$ value of not less than 9 or a dielectric constant of not less than 4. The dipole moment is desired to be in the range of 1 to 5 D. Incidentally, the range of from 1 to 1.5 D constitutes a boundary area.

Preferably, the polar detergent has a $\delta$ value in the range of 9 to 14 or a dielectric constant in the range of 4 to 45. Particularly, for the polar detergent to be effectively used for the removal of an active agent component of flux or such an extreme pressure agent as machining oil or cutting cutting oil, the $\delta$ value of the polar detergent is only required to be in the range of 9 to 14, preferably from 10 to 13. So long as the polar detergent has a $\delta$ value of not more than 14, it manifests fair compatibility with a detergent having a $\delta$ value of less than 9 and, therefore, amply imparts to the step of rinsing a quality of removing the used detergent. When the polar detergent has a $\delta$ value of not less than 9, it accomplishes ideal removal of flux and an ionic substance contained in the machining oil or the cutting oil.

The polar detergents which have $\delta$ values in the range of 9 to 14 or dielectric constants in the range of 4 to 45 include alcohols, glycols, phenols, ketones, fatty acids and fatty anhydrides, esters, amines, amides, quaternary ammonium salts, nitriles, morpholines, sulfoxides, sultones, phosphates and derivatives thereof, and N-methyl-2-pyrrolidone can be cited.

As concrete examples of these polar detergents, such alcohols as methanol, ethanol, propanol, normal hexanol, 3,5,5-trimethyl hexanol, 2-ethyl hexanol, normal octanol, normal butanol, cyclohexanol, and benzyl alcohol, such glycols as propylene glycol monoethyl ether, propylene glycol monobutyl ether, ethylene glycol monobutyl ether, and derivatives thereof, such phenols as orthocresol, metacresol, paracresol, and derivatives thereof, such ketones as acetophenone, acetone, methylethyl ketone, methylisobutyl ketone, diisobutyl ketone, cyclohexanone, and derivatives thereof, such fatty acids and fatty anhydrides as acetic acid, acetic anhydride, and derivatives thereof, such esters as methyl acetate, ethyl acetate, butyl acetate, ethyl lactate, methyl lactate, diethyl oxalate, and derivatives thereof, such amines as ethyl amine, N,N-dimethyl nitroamine and derivatives thereof, such amides as N,N-dimethyl acetamide, N,N-dimethyl formamide, N,N-diethyl formamide, N-ethyl acetamide, and derivatives, such quaternary ammonium salts as tetramethyl ammonium and derivatives thereof, such nitriles as isobutylonitrile, propionitrile, acetonitrile, and derivatives thereof, such morpholines as ethyl morpholine, N-acetyl morpholine, N-formyl morpholine, and derivatives thereof, such sulfoxides as dimethyl sulfoxide and derivatives thereof, such sultones as propane sultone and derivatives thereof, and such phosphates as triethyl phosphate, tributyl phosphate, and derivatives thereof can be cited. These polar detergents can be used either singly or in the form of a combination of two or more components.

The detergents of the present invention which have $\delta$ values of less than 9 and dielectric constants of less than 4 include polyorganosiloxanes, hydrocarbons, perfluorocarbons, hydrofluoro-carbons, ethers, and acetals. As concrete examples of these detergents, such polyorganosiloxanes as octamethyl cyclotetra-siloxane, decamethyl cyclopentasiloxane, and other similar low molecular weight polyorganosiloxanes, and derivatives thereof, such hydrocarbons as iso-paraffins represented by IP solvents 1016, 1620, 2028, and 2835 (Trademarks of the products of Idemitsu Petro-chemical Co., Ltd.) and mixed solvents of iso-paraffins with naphthene represented by Shellsols $D_{40}$ and $D_{70}$ (Trademarks of the products of Shell Japan K.K.), such perfluorocarbons as the perfluoro compounds represented by the formula (III) and the structural formula (IV) mentioned above, such hydrofluoro-carbons as the hydrofluoro compounds represented by the formula (V) mentioned above, such ethers as 1,4-dioxane and derivatives thereof, and such acetals as methylal and derivatives thereof can be cited. These detergents can be used either singly or in the form of a combination of two or more components.

Among other low molecular weight polyorganosiloxanes mentioned above, the polyorganosiloxanes represented by the formula (I) and the formula (II) mentioned above prove to be particularly desirable. The symbol R in the formula (I) and the formula (II) stands for a substituted or an unsubstituted monovalent organic group. As concrete examples of this organic group, such monovalent unsubstituted hydrocarbon groups as alkyl groups including methyl group, ethyl group, propyl group, and butyl group and phenyl group and such monovalent substituted hydrocarbon groups as trifluoromethyl group and 3,3,3-trifluoro-propyl group can be cited. As concrete examples of the symbol R at the terminal in the formula (I), amino group, amide group, acrylic ester groups, and mercaptan group can be cited. In all the groups enumerated above, methyl group proves to be most desirable from the viewpoint of the stability of system and the retention of volatility.

Examples of the polar detergents having $\delta$ values in the range of 9 to 14 or dielectric constants in the range of 4 to 45 as described above are shown in Table 4 (1) and examples of the detergents having $\delta$ values of less than 9 and dielectric constants of less than 4 are shown in Table 4 (2).

TABLE 4

| Name of detergent | δ value | Dielectric constant | Dipole moment |
|---|---|---|---|
| Polar detergents | | | |
| 3,5,5-Trimethyl hexanol | 10–11 | | |
| 3-Methoxy-3-methyl-1-butanol | 9.3 | | |
| n-Hexanol | 10.77 | 13.3 | |
| 2-methyl cyclohexanol | | 13.3 | 1.95 |
| Isopentyl alcohol | 10.0 | 14.7 | 1.82 |
| Ethanol | 12.78 | 25.7 | 1.68 |
| Ethylene glycol monomethyl ether | | 16 | 2.04 |
| o-Cresol | | 11.5 | 1.41 |
| Acetophenone | | 17.39 | 2.96 |
| Acetic anhydride | 10.3 | 20.7 | 2.82 |
| Ethyl acetate | 8.91 | 6.02 | 1.88 |
| Isopropyl alcohol | 11.44 | 18.6 | 1.68 |
| N,N-Dimethyl nitroamine | 13.1 | | |
| N,N-dimethyl acetamide | | 37.78 | 3.72 |
| N-ethyl acetamide | 12.3 | | |
| N,N-diethyl formamide | 10.6 | | |
| Morpholine | | 7.1 | 1.50 |
| N-acetyl morpholine | 11.6 | | |
| N-formyl morpholine | 13.0 | | |
| Isobutyl nitrile | | 20.4 | 3.61 |
| Propionitrile | 10.8 | | |
| Acetonitrile | 11.9 | | |
| Dimethyl sulfoxide | | 45 | 4.3 |
| N-methyl-2-pyrrolidone | 14.7 | | |
| Ethyl lactate | 10.0 | | |
| Butyl lactate | 9.4 | | |
| Propane sultone | | | 4.70 |
| Triethyl phosphate | | | 3.07 |
| Detergents | | | |
| Octamethyl cyclotetrasiloxane | 6.0 | 2.39 | 1.09 |
| IP solvent | 7.3 | | |
| Shellsol D$_{40}$ | 7.6 | 2.1 | 0 |
| Octamethyl trisiloxane | 6.0 | 2.30 | 0.99 |
| Naphthesol L | 8.0 | | |
| Hexamethyl disiloxane | 6.2 | 2.17 | 0.79 |
| Dodecane | | 2.016 | |
| Perfluorocarbon | 5.5–6.0 | 1.7–1.9 | |
| Hydrochlorofluorocarbon | 6–7 | | |
| 1,4-Dioxane | | 2.2 | |
| Methylal | | 2.7 | 0, 0.45 |

Note)
The magnitudes of dipole moment shown in this table are referential values quoted from various pieces of literature. Since these magnitudes of dipole moment are variable with the method of determination such as the method of temperature variation, the method of refractive index, and the method of solution. The magnitudes of dipole moment given in this table form no basis for the determination of δ values and dielectric constants.

The detergent having a δ value of less than 9 and a dielectric constant of less than 4 and used at the step of rinsing in the second method of cleaning according to this invention manifests not only a rinsing effect for minimizing the concentration of the detergent adhering to an object for cleaning or removing the adhering detergent from the object but also a dissolving power exerted on the rosin component of flux and the base oil in the machining oil. It is, therefore, allowable to use a polar detergent having a δ value in the range of 9 to 14 or a dielectric constant in the range of 4 to 45 as mixed with a detergent having a δ value of less than 9 and a dielectric constant of less than 4. Particularly, ideal cleaning is realized by cleaning an object for cleaning with a detergent produced by mixing a polar detergent with a low molecular weight polyorganosiloxane and/or a hydrocarbon and subsequently rinsing and/or drying the cleaned object with a detergent having a δ value of less than 9 and a dielectric constant of less than 4. For the purpose of imparting an enhanced drying property to the cleaned object, the hydrocarbon is desired to be a linear and/or a cyclic aliphatic hydrocarbon. In this case, the proportion at which the polar detergent is incorporated in the mixed detergent can be an irreducible minimum and yet must be incapable of impairing the cleaning property and the drying property of the detergents to be used. Specifically, it is in the range of 10 to 50% by weight, preferably from 15 to 30% by weight, based on the total weight of the mixed detergent. So long as this proportion is not less than 10% by weight, the produced detergent acquires an ability to dissolve the flux and the polar substance contained in the machining oil, prevents the decrease of the insulation resistance of a packaged substrate which is liable to occur when an ionic substance persists on the substrate, precludes the occurrence of poor leakage and corrosion of wiring and leads, and enables the substrate to keep its reliability intact. When the proportion of the polar detergent to the mixed detergent exceeds 50% by weight, the object which has been rinsed exclusively with a detergent having a δ value of less than 9 can be endowed with an ideal drying property.

The step of drying in the second method of cleaning according to this invention is effectively performed by various methods such as, for example, vapor drying, hot air drying, and spontaneous drying. The method actually adopted is suitably selected depending on such factors as the shape of an object for cleaning. Optionally, two or more methods can be jointly used. In cases where precision cleaning is particularly required, this step is desired to be performed by vapor drying which enjoys a relatively high finishing property. The vapor drying agent to be used for the vapor drying is desired to have a δ value of less than 9 and a dielectric constant of less than 4. For the sake of precision cleaning, it is more desirable to use at least one detergent which is selected from the group consisting of perfluorocarbon, hydrofluorocarbon, hydrochlorofluorocarbon, and hexamethyldisiloxane. Incidentally, the hydrochlorofluorocarbon is desirable in respect that it has an extremely small ozone depletion coefficient.

Specifically, the compounds which are represented by the formulas (III) and (IV) mentioned above are usable as perfluorocarbons and the compounds which are represented by the formula (V) are usable as hydrofluorocarbons.

The drying can be effected by the displacement of the polar detergent adhering to the cleaned object with a detergent having a high vapor pressure relative to the polar detergent. This method is effective in drying the wet object quickly at a low temperature.

In the second method of cleaning according to this invention, the step of rinsing and the step of drying which follow the step of cleaning with the polar detergent can be continuously carried out. Optionally, the step of rinsing or the step of drying can be omitted.

By the second method of cleaning according to this invention, the object for cleaning is first cleaned with a polar detergent and then rinsed and dried with a detergent which has low polarity or no polarity as described above. In the precision cleaning of an electronic part, therefore, this method exhibits satisfactory cleaning and drying properties.

Now, the apparatus which is adopted for working the second method of cleaning according to this invention will be described below. This apparatus is constructed as illustrated in FIG. 2 or FIG. 3.

In working the second method of cleaning, the number of cleaning baths and that of rinsing baths are not particularly restricted but can be arbitrarily fixed depending on the amount and the kind of smears adhering to the parts to be cleaned. The rinsing means and the drying means can be freely disposed to suit the convenience of operation.

The vapor drying agents which are used in the cleaning, the rinsing, and the drying means are desired to be regenerated by distillation and put to use again. Particularly, in the use of a method which comprises first cleaning an object for cleaning with a mixture of a polar detergent having a δ value in the range of 9 to 14 with a low molecular weight polyorganosiloxane and/or a hydrocarbon type detergent and then drying the cleaned object, since the component devices of the apparatus can be connected by the detergent cascade (overflow) method, the procedure which comprises regenerating the smeared liquid with a distilling device and returning the regenerated liquid to a final cleaning bath facilitates the management of the liquid as compared with the procedure in which the detergent and the rinsing liquid are managed independently of each other, and further elongates the service life of the liquid and consequently allows a generous cut of the running cost of the apparatus. For the sake of the regeneration by distillation, the component detergents of the mixed detergent are desired to have as close boiling points to each other as permissible. From the standpoint of the stability of mixing ratio, the component detergents are desired to have boiling points in the range of 150° to 200° C.

BEST MODE FOR CARRYING OUT THE INVENTION

Figure 1A:
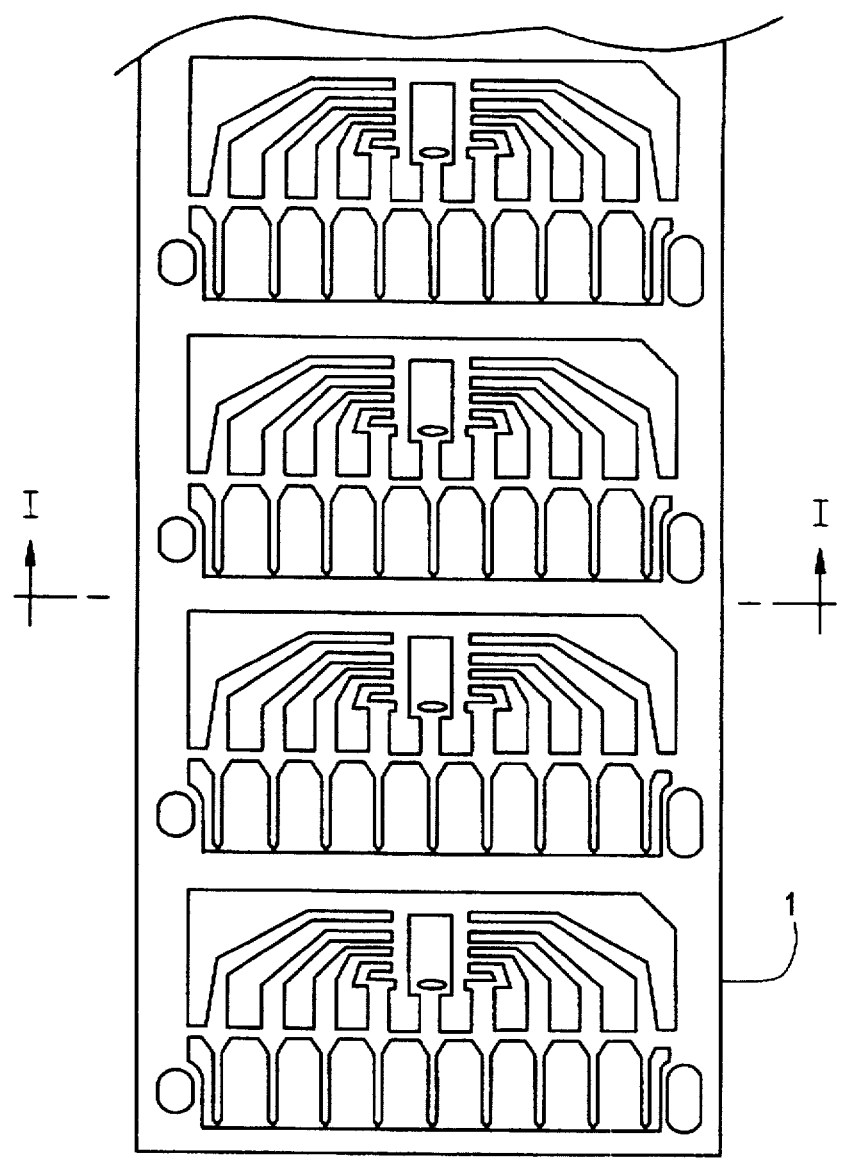
FIG. 1A and FIG. 1B are diagrams illustrating transistor grade lead frames subjected to cleaning as one embodiment of the present invention.
Figure 1B:
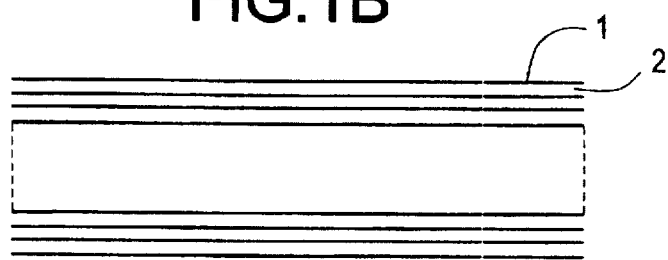

Now, this invention will be described more specifically below with reference to working examples. Examples 1 through 10 and Comparative Experiments 1 through 4 concern the first detergent, method of cleaning, and apparatus for cleaning and Examples 11 through 36 and Comparative Experiments 5 through 10 concern the second method of cleaning and apparatus for cleaning.

EXAMPLE 1

A detergent D-1 was obtained by stirring 60% by weight of octamethyl cyclotetrasiloxane, 30% by weight of isododecane, 5% by weight of 2-ethylhexanol, and 5% by weight of normal butanol until thorough mixture. The δ values and the contact angles of these components are shown in Tables 1 through 3.

EXAMPLE 2

A detergent D-2 was obtained by stirring 40% by weight of octamethyl cyclotetrasiloxane, 40% by weight of a naphthene type hydrocarbon (boiling point 160° to 200° C.), 5% by weight of butyl acetate, 5% by weight of normal butanol, and 2% by weight of diethylene glycol monobutyl ether until thorough mixture. The δ values and the contact angles of these components are shown in Tables 1 through 3.

EXAMPLE 3

A machining oil P-1 consisting of 85% by weight of liquid paraffin, 8% by weight of iso-stearic acid, and 7% by weight of chlorinated paraffin was prepared. Transistor grade lead frames (20 mm×150 mm×0.25 mm) of 42 alloy were punched out with the aid of the machining oil P-1. Eight hundred (800) lead frames as cohered fast through the medium of the machining oil P-1 were set in place in a basket and cleaned with the detergent D-1 obtained in Example 1 in an apparatus for cleaning of Example 10 to be cited hereinbelow. The oil films which intervened between the tightly cohering lead frames before the cleaning had a thickness of about 8 μm. At the step of cleaning, the cleaning bath was filled with the detergent D-1 and the lead frames set in the basket were immersed in the bath and subjected therein to ultrasonic cleaning under the conditions of 30° C., 5 min., and 40 KHz. Thereafter, the lead frames were transferred into a vapor drying bath and dried therein by the use of perfluorooctane ($C_8F_{18}$) under the conditions of 100° C. and 3 min.

The cleaning property was evaluated by the methods shown below. The results are shown in Table 5.

(1) Test for evaluating a condition of separation

The condition of separation was reported by the number of lead frames which continued to cohere through the medium of the machining oil and defied cleaning. The mark "0/800" denotes perfect cleaning.

(2) Test for evaluating a surface condition

The surface condition was reported by the number of lead frames found to be spotted with residues of the machining oil or the detergent. The mark "0/800" denotes perfect absence of a discernible spot.

(3) Test for determining residual oil

Two of the 800 cleaned lead frames were randomly picked as samples and cleaned with 300 ml of carbon tetrachloride to extract the residual oil from the samples. The solvent containing the extract was determined by the use of an oil concentration tester (produced by Horiba K.K. and marketed under product code of "OCMA-220").

EXAMPLE 4

A machining oil P-2 consisting of 75% by weight of liquid paraffin, 15% by weight of iso-stearic acid, and 10% by weight of chlorinated paraffin was prepared. The punching of lead frames was carried out by following the procedure of Example 3. Eight hundred (800) lead frames tightly cohering through the medium of the machining oil P-2 were set in place in a basket and cleaned by the use of the detergent D-2 obtained in Example 2. At the step of cleaning, the cleaning bath was filled with the detergent D-2 and the lead frames set in the basket were immersed in the cleaning bath and subjected therein to ultrasonic cleaning under the conditions of 35° C., 3 min., and 28 KHz. Thereafter, the cleaned lead frames were subjected to hot air drying under the conditions of 60° C. and 10 min.

The cleaning property was evaluated by following the procedure of Example 3. The results are shown in Table 5.

Comparative Experiment 1

A machining oil P-1 consisting of 85% by weight of liquid paraffin, 8% by weight of iso-stearic acid, and 7% by weight of chlorinated paraffin was prepared. Transistor grade lead frames (20 mm×1500 mm×0.25 mm) of 42 alloy were punched out with the aid of the machining oil P-1. Eight hundred (800) lead frames tightly cohering through the medium of the machining oil P-1 were set in place in a basket and were cleaned with 1,1,1-trichloro-ethane. At the step of cleaning, the cleaning bath was filled with 1,1,1-trichloroethane and the lead frames set in place in the basket were immersed in the bath and subjected therein to ultrasonic cleaning under the conditions of 35° C., 8 min., and 28 KHz. Thereafter, the cleaned lead frames were transferred to a vapor drying bath and subjected therein to vapor drying under the conditions of 78° C. and 4 min.

The cleaning property was evaluated by following the procedure of Example 3. The results are shown in Table 5.

Comparative Experiment 2

A machining oil P-2 consisting of 75% by weight of liquid paraffin, 15% by weight of iso-stearic acid, and 10% by weight of chlorinated paraffin was prepared. Lead frames were punched out by following the procedure of Example 3. Eight hundred (800) lead frames tightly cohering through the medium of the machining oil P-2 were set in place in a basket, cleaned by the use of an aqueous solution containing 10% by weight of a detergent consisting of 5% by weight of sodium metasilicate, 5% by weight of sodium stearate, 15% by weight of polyoxyethylene nonylphenyl ether, and 15% by weight of water, and thereafter rinsed by the use of purified water. The rinsed lead frames were subjected to hot air drying under the conditions of 60° C. and 10 min.

The cleaning property was evaluated by following the procedure of Example 3. The results are shown in Table 5. It is clearly noted from Table 5 that the samples according to the present invention excelled in the condition of separation and the surface condition and showed very low residual oil concentrations.

TABLE 5

| | Machining oil | Detergent | Condition of separation | Surface condition | Residual oil |
|---|---|---|---|---|---|
| Ex 3 | P-1 | D-1 | 0/800 | 0/800 | 0.1 ppm |
| Ex 4 | P-2 | D-2 | 0/800 | 0/800 | 0.2 ppm |
| CE 1 | P-1 | Trichloroethane | 0/800 | 0/800 | 0.2 ppm |
| CE 2 | P-2 | Water type detergent | 796/800 | 796/800 | 38.7 ppm |

Note)
Ex = Example CE = Comparative Experiment

EXAMPLE 5 THROUGH EXAMPLE 8

Machining oils P-3 through P-6 were prepared. The compositions of these machining oils were as shown in Table 6. Detergents D-3 through D-6 corresponding to the machining oils P-3 through P-6 were obtained by following the procedure of Example 1. The compositions of these detergents D-3 through D-6 were as shown in Table 7.

IC grade lead frames (25 mm×200 mm×0.5 mm) of oxygen-free copper were punched out with the aid of the machining oils P-3 through P-6. Eight hundred (800) lead frames of each example tightly cohering through the medium of the machining oil were set in place in a basket and cleaned in an apparatus for cleaning of Example 9 or Example 10 to be cited hereinbelow using the detergent corresponding to the relevant machining oil. The oil films which intervened between the tightly cohering lead frames before the cleaning had a thickness of about 10 μm. The cleaning property was evaluated by following the procedure of Example 3. The results are shown in Table 8. In Example 5 and Example 6, the cleaned lead frames were dried by vapor drying under the same conditions as used in Example 3. In Example 7 and Example 8, the cleaned lead frames were subjected to hot air drying under the same conditions as used in Example 4.

Comparative Experiment 3

IC grade lead frames (25 mm×200 mm×0.5 mm) of oxygen-free copper were punched out with the aid of the machining oil P-6. Eight hundred (800) lead frames tightly cohering through the medium of the machining oil P-6 were set in place in a basket and cleaned and vapor dried by the use of 1,1,1-trichloroethane under the same conditions as used in Comparative Experiment 1.

The cleaning property was evaluated by following the procedure of Example 3. The results are shown in Table 8.

Comparative Experiment 4

IC grade lead frames (25 mm×200 mm×0.5 mm) of oxygen-free copper were punched out with the aid of the machining oil P-6. Eight hundred (800) lead frames tightly cohering through the medium of the machining oil P-6 were set in place in a basket and cleaned and vapor dried by the use of the detergent of Comparative Experiment 2 under the same conditions as used in Comparative Experiment 2.

The cleaning property was evaluated by following the procedure of Example 3. The results are shown in Table 8. It is clearly noted from Table 8 that the samples according to the present invention excelled in the condition of separation and the surface condition and showed very low residual oil concentrations.

TABLE 6

| | | (Unit: % by weight) Machining oil | | | |
|---|---|---|---|---|---|
| Composition | | P-3 | P-4 | P-5 | P-6 |
| Base oil | Liquid paraffin *1 | 50 | 30 | 40 | 30 |
| | Glyceride of oleic acid | 50 | 50 | 40 | 40 |
| Oiliness agent | Isostearic acid | | 20 | | |
| | Oleic acid | | | | 20 |
| Extreme pressure agent | Sulfide oil *2 | | | | |
| | Chlorinated paraffin *3 | | | | |
| | Diphenyl disulfide | | | 10 | |
| | Lauric phosphate | | | 10 | |
| | Lubrsol 5080A *4 | | | | 10 |

Note)
*1: Viscosity (25° C.) 30 cSt
*2: Product of Dai-Nippon Ink & Chemicals, Inc. and marketed under trademark designation of "Sulfide oil 150"
*3: Product of Ajinomoto Co., Ltd.
*4: Product of Nippon Lubrsol K.K.

TABLE 7

| | (Unit: % by weight) Detergent | | | |
|---|---|---|---|---|
| Composition | D-3 | D-4 | D-5 | D-6 |
| Octamethyl cyclotetrasiloxane | 70 | 60 | 50 | 50 |
| Isododecane | 10 | 10 | 20 | 10 |
| Naphthene (bp 160–200° C.) | 20 | 20 | 20 | 25 |
| Normal butyl acetate | | 10 | | 5 |
| 2-Ethylhexanol | | | | 10 |
| Normal butanol | | | 10 | |

TABLE 8

| | Machining oil | Detergent | Condition of separation | Surface condition | Residual oil |
|---|---|---|---|---|---|
| Ex 5 | P-3 | D-3 | 0/800 | 0/800 | 0.1 ppm |
| Ex 6 | P-4 | D-4 | 0/800 | 0/800 | 0.2 ppm |
| Ex 7 | P-5 | D-5 | 0/800 | 0/800 | 0.2 ppm |
| Ex 8 | P-6 | D-6 | 0/800 | 0/800 | 0.1 ppm |
| CE 3 | P-6 | Trichloroethane | 0/800 | 0/800 | 0.2 ppm |
| CE 4 | P-6 | Water type detergent | 798/800 | 798/800 | 55.6 ppm |

EXAMPLE 9

Figure 2:
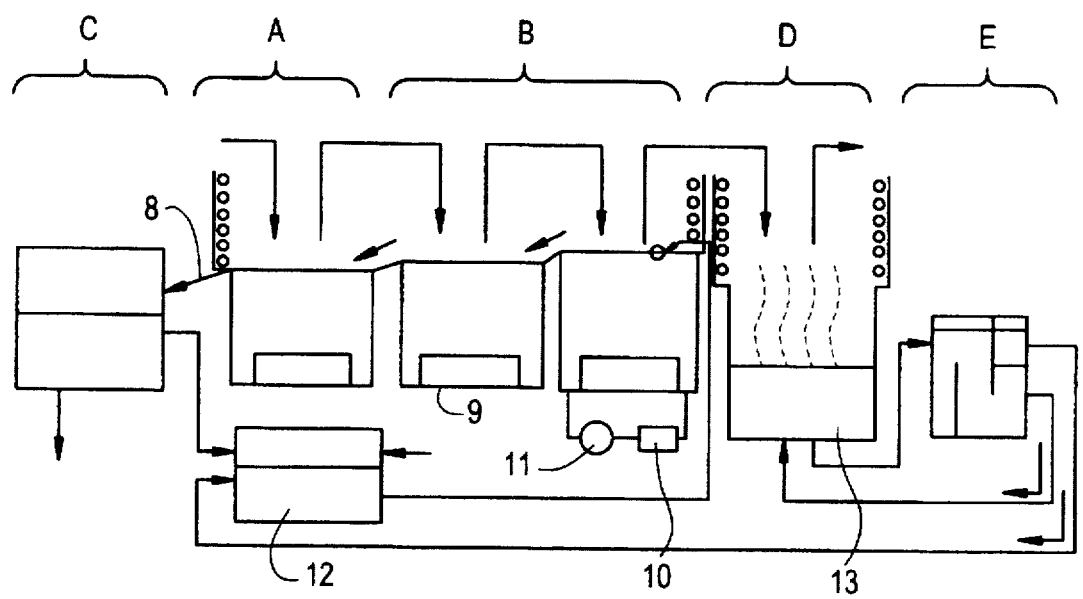
FIG. 2 is a diagram illustrating an apparatus for cleaning comprising a plurality of cleaning baths as one embodiment of this invention.

The construction of an apparatus for cleaning of Example 9 is illustrated in FIG. 2. FIG. 2 shows a case of using a plurality of cleaning baths in the apparatus for cleaning. The apparatus shown in the diagram is roughly composed of a cleaning step A, a rinsing step B, a detergent regenerating mechanism C, a vapor cleaning and drying step D, and a vapor detergent regenerating mechanism E. The cleaning step A and the rinsing step B are provided with an overflow separating function and a liquid level adjusting sensor. In the diagram, the arrow marks indicate the flows of liquid. For the operations of the cleaning step A and the rinsing step B, either a single cleaning bath or a plurality of connected cleaning baths can be selected depending on such factors as the duration of cleaning and the quality of cleaning. This rule of selection holds good also for the number of cleaning baths.

In the present example, three connected baths are used and these baths are connected with drain pipes (not shown) and overflow pipes 8. These baths are severally operated as coupled with such optional devices as resort to ultrasonic wave, oscillation, mechanical agitation, application of heat to the detergent, and brushing and, are consequently enabled thereby to manifest an improved cleaning property. In the apparatus of this example, ultrasonic wave generating devices 9 are installed. The final bath at the rinsing step B is provided with a foreign matter removing filter 10 and a smear detecting device 11. The smear removing filter offers a varied choice in kind depending on the material of the object for cleaning or the quality of the machining oil. For example, microporous ceramic filters, glass filters, organic polymer filters, and filters variously combining such filters which invariably have a pore size in the approximate range of from 0.1 to 20 μm are desirably used. The smear detecting device 11 is adapted to operate by utilizing an infrared spectro-photometer or an ultraviolet spectrophotometer.

The detergent regenerating mechanism C separates the detergent forwarded thereto through the overflow pipes 8 into the components of the detergent and the smears originating in the machining oil by dint of the differences of boiling point. The regenerated detergent is temporarily stored in a spare tank 12 and then supplied to the cleaning bath of the rinsing step B.

At the vapor cleaning and drying step D, the detergent is quickly displaced with a vapor drying liquid to effect precision drying.

The vapor drying and regenerating mechanism E separates the detergent and the vapor drying agent by dint of the differences of specific gravity between the components of the detergent and the vapor drying agent. The detergent thus separated is supplied to the spare tank 12 and the vapor drying agent to a vapor drying tank 13.

EXAMPLE 10

Figure 3:
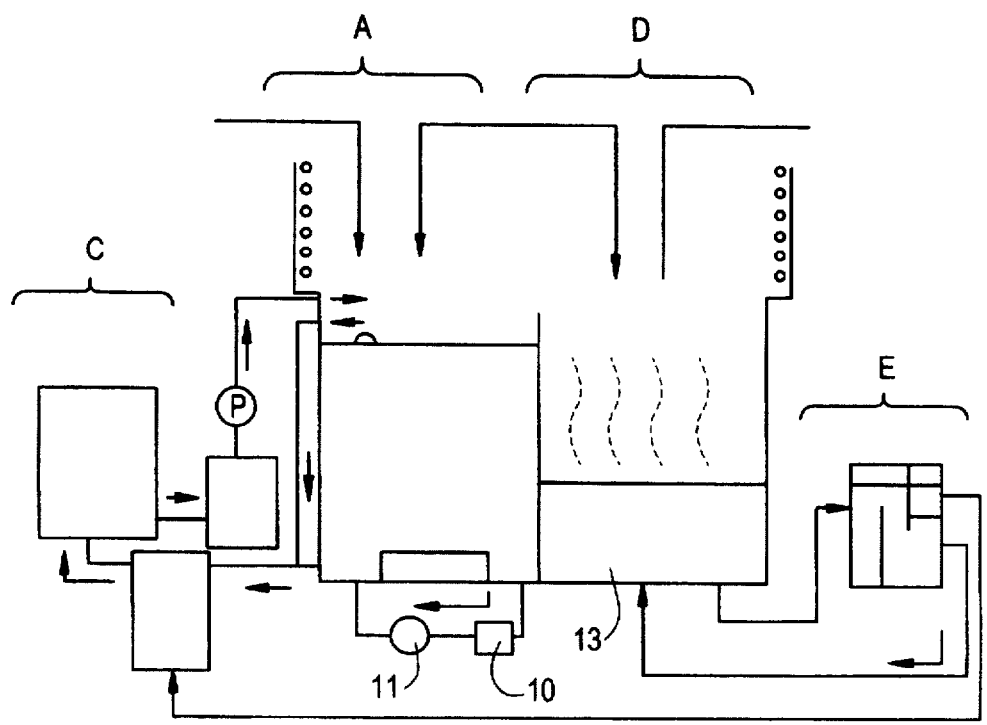
FIG. 3 is a diagram illustrating an apparatus for cleaning comprising one cleaning bath as one embodiment of this invention.

The construction of an apparatus for cleaning of Example 10 is illustrated in FIG. 3. FIG. 3 shows a case of using one cleaning bath in the apparatus for cleaning. The apparatus for cleaning illustrated in the diagram roughly comprises a cleaning step A, a detergent regenerating mechanism C, a vapor cleaning and drying step D, and a vapor detergent regenerating mechanism E. The cleaning step A is provided with an overflow separating function and a liquid level adjusting sensor.

In the cleaning bath, the same ultrasonic device, smear removing filter, and smear detector as used in Example 9 are installed. The detergent regenerating mechanism C, the vapor cleaning and drying step D, and the vapor detergent regenerating mechanism E which are used in the present apparatus for cleaning and drying are identical in both construction and function with those of Example 9.

EXAMPLE 11

Lead frames (50 mm×150 mm×0.25 mm) of 42 alloy were punched out with the aid of the machining oil P-2 of Example 4 so as to acquire varying contact areas of not less than 100 mm² to less than 800 mm², from not less than 800 mm² to less than 2500 mm², from not less than 2500 mm² to less than 4000 mm², from not less than 4000 mm₂ to less than 7000 mm², and from 7000 mm² upward. The lead frames of varying contact areas were cleaned with the detergent D-1 in the apparatus for cleaning of Example 10. At the cleaning step, the cleaning bath was filled with the detergent D-1 and the lead frames set in place in a basket were immersed in the cleaning bath and subjected therein to ultrasonic cleaning under the conditions of 30° C., 5 min., and 40 KHz. Thereafter, the cleaned lead frames were transferred into the vapor drying bath and dried therein by vapor drying with perfluorooctane ($C_8F_{18}$) under the conditions of 100° C. and 3 min.

The cleaning property was evaluated by following the procedure of Example 3. The results are shown in Table 9. It is clearly noted from Table 9 that the samples according to the present invention excelled in the condition of separation and the surface condition and showed very low residual oil concentrations.

TABLE 9

| Contact area | Machining oil | Detergent | Condition of separation | Surface condition | Residual oil |
| --- | --- | --- | --- | --- | --- |
| 100 mm² to less than 800 mm² | | | 0/800 | 0/800 | 0.1 ppm |
| 800 mm² to less than 2500 mm² | | | 0/800 | 0/800 | 0.2 ppm |
| 2500 mm² to less than 4000 mm² | P-2 | D-1 | 0/800 | 0/800 | 0.2 ppm |
| 4000 mm² to less than 7000 mm² | | | 0/800 | 0/800 | 0.1 ppm |
| From 7000 mm² upward | | | 0/800 | 0/800 | 0.2 ppm |

EXAMPLES 12 THROUGH 37 AND COMPARATIVE EXPERIMENTS 5 THROUGH 10

Comb substrates [JIS (Japanese Industrial Standard) Z-3197, Type 2] were coated with flux (produced by Tamura Kaken K.K. and marketed under product code of "RA type CRV-5V"), preheated at temperatures of from 100° to 120° C. to expel the solvent, and baked at temperatures of from 230° to 260° C. for 30 seconds. The comb substrates thus processed were used as samples for the evaluation of cleaning property. The samples were cleaned and rinsed for removal of the adhering flux with the detergents of the compositions shown in Example 12 through 37 and Comparative Experiments 5 through 10 under the conditions of 40° C. of cleaning temperature, 400 W/28 KHz of supersonic output, 5 min. of cleaning time per two layers, and 5 min. of rinsing time per two layers and then dried. As respects the manner of drying, the samples of Example 19, Example 28, Example 35, Comparative Experiment 5, and Comparative Experiment 7 were subjected to hot air drying, those of Example 21, Example 29, and Example 37 to spontaneous drying, those of Example 22, Example 30, and Example 36 to vacuum drying, and those of the remaining examples and comparative experiments to vapor drying by the use of vapor detergents of the compositions shown in the relevant tables. The comb substrates thus cleaned and dried were evaluated for cleaning property by the determination of ion residue, insulation resistance, presence or absence of white residue, and drying time. The methods for determination of these factors are shown below. The results of the evaluation are shown in Tables 9 through 13. It is clearly noted from the results of Tables 9 through 13 that the samples of the working examples of this invention excelled the samples of the comparative experiments in cleaning property and drying property as evinced by smaller amounts of ion residue, lower magnitudes of insulation resistance, absence of white residue, and shorter drying times.

TABLE 9

| Example | Composition of detergent (wt %) | Composition of rinsing agent (wt %) | Vapor drying agent | | | | Results of cleaning | | | | |
|---|---|---|---|---|---|---|---|---|---|---|---|
| | | | Perfluoro-carbon | HFC | HCFC | Hexamethyl disiloxane | Ion residue (μg · NaCl/in$^2$) | Insulation resistance ×10$^3$(Ω) | White residue | Drying time (sec) | Ozone depletion coefficient |
| 12 | 3,5,5-Trimethyl-hexanol 100 | Octamethyl cyclo-tetrasiloxane 100 | 100 | — | — | — | 3.2 | 29 | 0/20 | 19 | 0 |
| 13 | 3-Methoxy-3-methyl-1-butanol 100 | Octamethyl cyclo-tetrasiloxane 100 | — | 100 | — | — | 2.1 | 33 | 0/20 | 21 | 0 |
| 14 | n-Hexanol 100 | IP Solvent 1620 100 | — | — | 100 | — | 4.1 | 45 | 0/20 | 31 | 0.01–0.04 |
| 15 | 2-Methylcyclohexanol 100 | Octamethyl-cyclotetrasiloxane 50 IP Solvent 1620 50 | — | — | — | 100 | 1.5 | 38 | 0/20 | 25 | 0 |
| 16 | Isopentyl alcohol 100 | Octamethyl-cyclotetrasiloxane 80 Shellsol D$_{40}$ 20 | 80 | — | — | 20 | 3.0 | 42 | 0/20 | 20 | 0 |
| 17 | 3,5,5-Trimethyl-hexanol 50 3-Methoxy-3-methyl-1-butanol 50 | Octamethyl-cyclotetrasiloxane 100 | 100 | — | — | — | 3.9 | 51 | 0/20 | 17 | 0 |
| 18 | 3,5,5-Trimethyl-hexanol 15 Shellsol D$_{40}$ 45 Octamethyl cyclo-tetrasiloxane 40 | — | 100 | — | — | — | 2.2 | 47 | 0/20 | 21 | 0 |
| 19 | n-Hexanol 20 IP Solvent 1620 50 Octamethyl cyclo-tetrasiloxane 30 | — | Hot air drying (50° C.) | | | | 2.8 | 5.0 | 0/20 | 70 | 0 |
| 20 | 3-Methoxy-3-methyl-1-butanol 25 Naphthesol L 40 Octamethyl trisiloxane 35 | — | 50 | 50 | — | — | 3.0 | 28 | 0/20 | 36 | 0 |
| 21 | Ethanol 15 Hexamethyl-disiloxane 85 | — | Spontaneous drying (25° C.) | | | | 2.7 | 3.0 | 0/20 | 120 | 0 |
| 22 | 3,5,5-Trimethyl hexanol 100 | Octamethyl-trisiloxane 100 | Vacuum drying (10 Torr. 30° C.) | | | | 3.0 | 2.0 | 0/20 | 25 | 0 |

TABLE 10

| Example | Composition of detergent (wt %) | Composition of rinsing agent (wt %) | Vapor drying agent | | | | Results of cleaning | | | | |
|---|---|---|---|---|---|---|---|---|---|---|---|
| | | | Perfluoro-carbon | HFC | HCFC | Hexamethyl disiloxane | Ion residue (μg · NaCl/in$^2$) | Insulation resistance ×10$^3$(Ω) | White residue | Drying time (sec) | Ozone depletion coefficient |
| 23 | n-Hexanol 50 Ethanol 50 | Octamethyl cyclotetrasiloxane 100 | 100 | — | — | — | 3.5 | 22 | 0/20 | 29 | 0 |
| 24 | Ethylene glycol-monomethyl ether 50 Ethanol 50 | Dodecane 100 | — | — | — | 100 | 3.4 | 31 | 0/20 | 33 | 0 |
| 25 | o-Cresol 50 Acetophenone 50 | 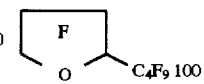 | — | 100 | — | — | 3.9 | 40 | 0/20 | 20 | 0 |

TABLE 10-continued

| | | Vapor drying agent | | | | Results of cleaning | | | | |
|---|---|---|---|---|---|---|---|---|---|---|
| Example | Composition of detergent (wt %) | Composition of rinsing agent (wt %) | Perfluoro-carbon | HFC | HCFC | Hexa-methyl disiloxane | Ion residue (μg · NaCl/in$^2$) | Insulation resistance ×10$^3$(Ω) | White residue | Drying time (sec) | Ozone depletion coefficient |
| 26 | Acetic anhydride 50 Ethyl acetate 50 | $C_7F_{16}$ 50 $C_3HCl_2F_5$ 50 | — | — | 100 | — | 2.5 | 41 | 0/20 | 25 | 0.01–0.04 |
| 27 | Isopropyl alcohol 50 N,N-Dimethyl-acetamide 50 | $C_3HCl_2F_5$ 80 1.4-Dioxane 20 | 80 | — | — | 20 | 2.3 | 16 | 0/20 | 35 | 0.01–0.04 |
| 28 | Isopropyl alcohol 50 Morpholine 30 Isobutylonitrile 20 | $C_5H_2F_{10}$ 90 Methylal 10 | Hot air drying (50° C.) | | | | 2.1 | 5.5 | 0/20 | 40 | 0 |
| 29 | Isopropyl alcohol 50 Dimethyl sulfoxide 30 Ethyl lactate 20 | $C_3HCl_2F_5$ 80 Octamethyl-trisiloxane 20 | Spontaneous drying (25° C.) | | | | 2.1 | 1.0 | 0/20 | 60 | 0.01–0.04 |

TABLE 11

| | | Vapor drying agent | | | | Results of cleaning | | | | |
|---|---|---|---|---|---|---|---|---|---|---|
| Example | Composition of detergent (wt %) | Composition of rinsing agent (wt %) | Perfluoro-carbon | HFC | HCFC | Hexa-methyl disiloxane | Ion residue (μg · NaCl/in$^2$) | Insulation resistance ×10$^3$(Ω) | White residue | Drying time (sec) | Ozone depletion coefficient |
| 30 | 3-Methoxy-3-methyl-1-butanol 50 Butyl lactate 50 | $C_3HCl_2F_5$ 50 Octamethyl-trisiloxane 30 IP-Solvent 1620 20 | Vacuum drying (10 Torr. 30° C.) | | | | 2.5 | 4.8 | 0/20 | 35 | 0.01–0.04 |
| 31 | Ethanol 20 Hexamethyl-disiloxane 80 | Hexamethyl-disiloxane 100 | 100 | — | — | — | 4.0 | 48 | 0/20 | 30 | 0 |
| 32 | Ethylene glycol-monoethyl ether 20 Dodecane 80 | Dodecane 100 | — | — | — | 100 | 3.8 | 11 | 0/20 | 32 | 0 |
| 33 | o-Cresol 50 1.4-Dioxane 50 | $C_6H_3F_{11}$ 100 | — | 100 | — | — | 3.8 | 35 | 0/20 | 38 | 0 |
| 34 | Acetophenone 50 Methylal 50 | $C_8F_{18}$ 50 $C_3HCl_2F_5$ 50 | 50 | — | 50 | — | 3.4 | 50 | 0/20 | 35 | 0.01–0.04 |
| 35 | Acetic anhydride 50 Methylal 50 | $C_3HCl_2F_5$ 80 1.4-Dioxane 20 | Hot air drying (30° C.) | | | | 3.3 | 8.5 | 0/20 | 40 | 0.01–0.04 |

TABLE 12

| | | Vapor drying agent | | | | Results of cleaning | | | | |
|---|---|---|---|---|---|---|---|---|---|---|
| Example | Composition of detergent (wt %) | Composition of rinsing agent (wt %) | Perfluoro-carbon | HFC | HCFC | Hexa-methyl disiloxane | Ion residue (μg · NaCl/in$^2$) | Insulation resistance ×10$^3$(Ω) | White residue | Drying time (sec) | Ozone depletion coefficient |
| 36 | Ethyl acetate 40 Hydrochloro-fluorocarbon 60 | $C_6H_3F_{11}$ 90 Methylal 10 | Vacuum drying (10 Torr. 30° C.) | | | | 3.6 | 6.9 | 0/20 | 30 | 0 |
| 37 | Ethanol 20 Hydrofluoro-carbon 80 | $C_5H_2F_{10}$ 100 | Spontaneous drying (25° C.) | | | | 4.0 | 9.0 | 0/20 | 50 | 0 |

TABLE 13

| Comparative Experiment | Composition of detergent (wt %) | Composition of rinsing agent (wt %) | Method of drying | Results of cleaning | | | | |
|---|---|---|---|---|---|---|---|---|
| | | | | Ion residue ($\mu g \cdot NaCl/in^2$) | Insulation resistance $\times 10^{13}(\Omega)$ | White residue | Drying time (sec) | Ozone depletion coefficient |
| 5 | Shellsol $D_{40}$ 60 Octamethyl-cyclotetrasiloxane 40 | — | Hot air drying (50° C.) | 30 | 1.0 | 20/20 | 60 | 0 |
| 6 | IP Solvent 1620 100 | — | PFC ($C_8F_{18}$) vapor drying | 25 | 3.0 | 20/20 | 25 | 0 |
| 7 | 3,5,5-Trimethyl hexanol 100 | Purified water | Hot air drying (50° C.) | 13 | 0.05 | 9/20 | 2000< | 0 |
| 8 | IP Solvent 1620 100 | — | IPA vapor drying | 13 | 0.06 | 15/20 | 40 | 0 |
| 9 | | Flon 113 96 Ethanol 4 | | 13 | 3.1 | 2/20 | 11 | 0 |
| Referential Example | | Uncleaned | | 30 | 1.0 | — | — | — |

(4) Amount of ion residue

A given dried comb substrate was subjected to extraction with a solution (composed of 75% by weight of isopropyl alcohol and 25% by weight of purified water). By the use of a cleanliness tester (produced by Nippon Alpha Metals K.K. and marketed under trade name of "Omega Meter 600SMD"), the resultant extract was tested for electric resistance and this electric resistance was converted to the equivalent value of NaCl ion. The NaCl ion equivalent thus obtained was reported as the amount of ion residue ($\mu g \cdot NaCl/in^2$).

(5) Insulation resistance

The resistance between the opposite electrodes of a given dried comb substrate was determined by the use of a digital superhigh resistance/microammeter (produced by Advantest K.K.). The resistance was measured three times and the three magnitudes obtained were averaged. The resultant average was reported as the insulation resistance.

(6) Presence or absence of white residue

Twenty (20) dried comb substrates were observed under a microscope to find the number, N, of comb substrates showing a discernible sign of white residue. The ratio N/20 was reported as the result.

(7) Drying time

In the case of the samples which were subjected to spontaneous drying, hot air drying, and vacuum drying, the time which had elapsed before the liquid adhering to the substrate surface ceased to exist was reported as the drying time. In the case of the samples which were subjected to vapor drying, the interval which occurred between the time the substrate was thrown in the vapor of the vapor detergent and the time the substrate was completely dried was reported as the drying time.

Industrial Applicability

The first detergent according to this invention manifests an outstanding dissolving power to machining oil because it uses a solvent having a solubility parameter difference of not more than 3 from the machining oil used in an object for cleaning. When the detergent is adapted to form a contact angle within 15° with the machining oil, it easily permeates into and dissolves the machining oil films intervening between thin metallic strips tightly cohering through the medium of the films and consequently provides an ideal cleaning to the cohering metal strips. When this detergent further uses at least one component selected from the group consisting of polyorganosiloxanes and organic carbon compounds which satisfy the characteristic properties mentioned above, it acquires a further improved permeating and dissolving power.

The detergent of this invention, unlike the Flon type and the chlorine type solvent, avoids inducing either destruction or pollution of the environment and compares favorably with the Flon type and the chlorine type solvent in terms of the cleaning power.

The first method of cleaning according to this invention can perform the cleaning step and the rinsing step and even the vapor drying step as well altogether with one and the same detergent.

This method is enabled to give a thorough wash to precision parts by cleaning these parts with the detergent mentioned above and, in addition thereto, subjecting the cleaned parts to a vapor drying step using a perfluoro compound as a vapor detergent.

The first apparatus for cleaning according to this invention, when operated by adopting the detergent and the method of cleaning mentioned above, contributes to decrease amply the cost of cleaning because it is so constructed as to permit easy separation and regeneration of the detergent and the vapor drying agent.

The second method of cleaning according to this invention comprises first cleaning a given object with a polar detergent and then rinsing and drying the cleaned object with a detergent having low polarity or no polarity. In the precision cleaning of such objects as electronic parts, therefore, this method, unlike the method using the Flon type and the chlorine type solvent, avoids inducing either destruction or pollution of the environment and manifests satisfactory cleaning and drying properties.

We claim:

1. A method for cleaning an object that has a smear of a machining oil containing at least one component selected from the group consisting of base oil, oiliness agent, and extreme pressure agent, wherein the object includes a gap portion, the method comprising cleaning the gap portion of the object with a detergent comprising a component that has a solubility parameter difference of not more than 3 with at least one component of the smear.

2. A method according to claim 1, which further comprises drying the cleaned object.

3. A method according to claim 2, wherein the step of drying is effected by use of a vapor drying agent.

4. A method according to claim 3, wherein the vapor drying agent comprises at least one component selected from the group consisting of one or more of a perfluoro compound, a hydrofluoro compound, a hydrochlorofluoro compound, and hexamethyl disiloxane.

5. The method according to claim 3, wherein said vapor drying agent is selected from the group consisting of perfluoro compounds and hydrofluoro compounds.

6. A method according to claim 1, wherein the gap portion has a distance in the range of 0.001 to 2000 µm.

7. A method according to claim 1, wherein the component has a solubility parameter difference of not more than 3 to not less than 5% by weight with at least one component of the smear.

8. A method according to claim 1, wherein the detergent comprising a polyorganosiloxane.

9. A method according to claim 1, wherein the detergent comprise an organic carbon compound.

10. A method according to claim 1, wherein the detergent comprises an aliphatic or aromatic hydrocarbon.

11. A method according to claim 1, wherein the component has a contact angle within 15° of at least one component of the smear.

12. A method of cleaning an object comprising (a) cleaning the object with a polar detergent having a solubility parameter of not less than 9 or a dielectric constant of not less than 4, (b) rinsing the cleaned object with a detergent having a solubility parameter of less than 9 and a dielectric constant of less than 4, or drying the cleaned object with a detergent having a solubility parameter of less than 9 and a dielectric constant of less than 4.

13. A method according to claim 12, wherein the polar detergent has a solubility parameter in the range of 9 to 14 or a dielectric constant in the range of 4 to 45.

14. A method according to claim 12, wherein the polar detergent comprises a mixture of (i) a polar detergent having a solubility parameter in the range of 9 to 14 or a dielectric constant in the range of 4 to 45 and (ii) a detergent having a solubility parameter of less than 9 and a dielectric constant of less than 4.

15. A method according to claim 12, wherein the drying step is performed.

16. A method according to claim 12, wherein the rinsing step is performed.

17. A method according to claim 12, wherein the drying step is used and is effected by displacement of said polar detergent with a detergent having a higher vapor pressure than that of said polar detergent.

18. A method according to claim 12, wherein the polar detergent comprises at least one component selected from the group consisting of alcohols, glycols, phenols, ketones, fatty acids, fatty acid anhydrides, esters, amines, amides, quaternary ammonium salts, nitrites, morpholines, sulfoxides, sulfones, phosphates and derivative thereof, and N-methyl-2-pyrrolidone.

19. A method according to claim 12, wherein the detergent of step (b) comprises at least one component selected from the group consisting of polyorganosiloxanes, hydrocarbons, perfluorocarbons, hydrofluoro-carbons, ethers, and acetals.

20. A method according to 12, wherein the detergent of step (b) comprises a low molecular weight polyorganosiloxane selected from the group consisting of the linear polydiorganosiloxanes represented by the formula (I):

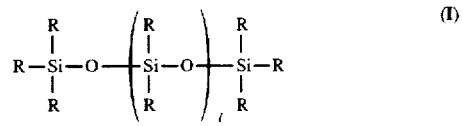

wherein R is independently selected from the group consisting of a substituted and an unsubstituted monovalent organic group and 1 is an integer from 0 to 5, and the cyclic polydiorganosiloxanes represented by the formula (II):

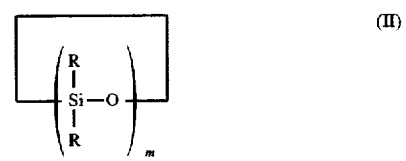

wherein R is independently selected from the group consisting of a substituted and an unsubstituted monovalent organic group and m is an integer from 3 to 7.

21. A method according to claim 12, wherein the detergent comprises one or more linear or cyclic aliphatic hydrocarbon.

22. A method according to claim 12, wherein the drying step is used and comprises use of a vapor drying detergent selected from the group of perfluoro compounds, hydrofluoro compounds, hydrochlorofluoro compounds, and hexamethyl disiloxane.

23. A method according to claim 22, wherein the step of vapor drying is effected by vapor drying with at least one detergent selected from the group of perfluoro compounds and hydrofluoro compounds.

24. A method according to claim 12, wherein both rinsing and drying are carried out.

25. An apparatus for cleaning an object comprising cleaning means including a single bath or a plurality of baths, at least one means selected from the group consisting of rinsing means and drying means, liquid separating means for regenerating and separating at least one polar detergent from a polyorganosiloxane or organic hydrocarbon detergent by distillation, a device for detecting the presence of a smear on the object, a liquid level sensor installed in at least one of said baths.

* * * * *

UNITED STATES PATENT AND TRADEMARK OFFICE
CERTIFICATE OF CORRECTION

PATENT NO. : 5,789,359
DATED : August 4, 1998
INVENTOR(S) : Hiroshi SHIMOZAWA, et al.

It is certified that error appears in the above-identified patent and that said Letters Patent is hereby corrected as shown below:

Please note on the front cover, Item [73] Assignees: change "Kabushiki Kaisha Toshiba, Kawasaki; Toshiba Silicone Co., Ltd., Tokyo, both of Japan" and replace with --Toshiba Silicone Co., Ltd., Tokyo, Japan--.

Item [56] References cited, Foreign Patent Documents cited on the Information Disclosure Statement filed November 26, 1995, acknowledged by Examiner, were not listed on the front cover, change "0 350 316     7/1989 European Pat. Off
0 403 962     6/1990 European Pat. Off.
0 376 779     7/1990 European Pat. Off.
0 458 969     10/1990 European Pat. Off.
0 516 029     5/1992 European Pat. Off.
0 529 869     8/1992 European Pat. Off.
40 31 563     4/1992 Germany
2 084 613     8/1981 United Kingdom"

UNITED STATES PATENT AND TRADEMARK OFFICE
CERTIFICATE OF CORRECTION

PATENT NO. : 5,789,359
DATED : August 4, 1998
INVENTOR(S) : Hiroshi SHIMOZAWA, et al.

Page 2 of 3

It is certified that error appears in the above-identified patent and that said Letters Patent is hereby corrected as shown below:

and replace with:

--0 350 316    7/1989 European Pat. Off
0 403 962    6/1990 European Pat. Off.
0 376 779    7/1990 European Pat. Off.
0 458 969    10/1990 European Pat. Off.
0 516 029    5/1992 European Pat. Off.
0 529 869    8/1992 European Pat. Off.
40 31 563    4/1992 Germany
60-79098    5/1985 Japanese Pat. Off
61-213297    9/1986 Japanese Pat. Off.
2-191581    7/1990 Japanese Pat. Off.
4-124289    4/1992 Japanese Pat. Off.
2 084 613    8/1981 United Kingdom
91/06621    5/1991 WIPO
91/13697    9/1991 WIPO
92/03205    3/1992 WIPO
93/04755    3/1993 WIPO
93/09217    5/1993 WIPO
International Search Report - PCT/ISA/210--.

UNITED STATES PATENT AND TRADEMARK OFFICE
CERTIFICATE OF CORRECTION

PATENT NO. : 5,789,359
DATED : August 4, 1998
INVENTOR(S) : Hiroshi SHIMOZAWA, et al.

It is certified that error appears in the above-identified patent and that said Letters Patent is hereby corrected as shown below:

Column 6, line 63, wherein ={( are improperly shown as superscripts,

"$\delta = (\Delta E/V)^{1/2=\{(} d/M)\Delta E\}^{1/2}$" should read

--$\delta = (\Delta E/V)^{1/2} = \{(d/M)\Delta E\}^{1/2}$--.

Signed and Sealed this

Twenty-second Day of August, 2000

*Attest:*

Q. TODD DICKINSON

*Attesting Officer*     *Director of Patents and Trademarks*